United States Patent
Sung et al.

(10) Patent No.: US 11,404,641 B2
(45) Date of Patent: Aug. 2, 2022

(54) METHOD OF MANUFACTURING DISPLAY APPARATUS

(71) Applicant: SAMSUNG DISPLAY CO., LTD., Yongin-si (KR)

(72) Inventors: Sijin Sung, Yongin-si (KR); Hyomin Kim, Yongin-si (KR); Illsoo Park, Yongin-si (KR); Gina Yoo, Yongin-si (KR); Jongseok Han, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 159 days.

(21) Appl. No.: 16/999,749

(22) Filed: Aug. 21, 2020

(65) Prior Publication Data

US 2021/0210686 A1 Jul. 8, 2021

(30) Foreign Application Priority Data

Jan. 6, 2020 (KR) .................. 10-2020-0001565

(51) Int. Cl.
*H01L 51/00* (2006.01)
*H01L 27/32* (2006.01)
*H01L 51/56* (2006.01)

(52) U.S. Cl.
CPC ...... *H01L 51/0021* (2013.01); *H01L 27/3246* (2013.01); *H01L 51/56* (2013.01); *H01L 2227/323* (2013.01); *H01L 2251/56* (2013.01)

(58) Field of Classification Search
CPC ... H01L 51/0021–0023; H01L 51/5203–5234; H01L 2251/56–564; H01L 27/3246
See application file for complete search history.

(56) References Cited

U.S. PATENT DOCUMENTS 8,049,402 B2    11/2011  Jeong et al.
2006/0183394 A1*  8/2006  Kim ............... H01L 51/5206
                                                 445/24

(Continued)

FOREIGN PATENT DOCUMENTS

CN       106024828 A  * 10/2016   ......... H01L 51/0017
JP       2006-216539      8/2006

(Continued)

OTHER PUBLICATIONS

Machine translation, Jin, Chinese Pat. Pub. No. CN-106024828-A, translation date: Mar. 15, 2022, Clarivate Analytics, all pages. (Year: 2022).*

(Continued)

*Primary Examiner* — Victoria K. Hall
(74) *Attorney, Agent, or Firm* — F. Chau & Associates, LLC

(57) ABSTRACT

A method of manufacturing a display apparatus includes: forming a pixel electrode on a substrate; forming a pixel defining layer covering at least an edge of the pixel electrode and including an opening exposing a part of the pixel electrode; performing first dry cleaning by adding oxygen gas ($O_2$) to a surface of the pixel electrode exposed by the opening in the pixel defining layer, wherein the oxygen gas ($O_2$) is added at a flow rate in a range of about 1,200 sccm to about 3,600 sccm; performing second dry cleaning after the first dry cleaning; forming an intermediate layer on the pixel electrode after the second dry cleaning; and forming an opposite electrode on the intermediate layer and the pixel defining layer.

20 Claims, 14 Drawing Sheets

(56) References Cited

U.S. PATENT DOCUMENTS

| | | | |
|---|---|---|---|
| 2008/0164810 A1* | 7/2008 | Oda | H01L 27/3258 |
| | | | 445/24 |
| 2009/0079925 A1* | 3/2009 | Kizaki | G02F 1/1395 |
| | | | 349/139 |
| 2010/0220254 A1* | 9/2010 | Liu | H01L 33/08 |
| | | | 438/30 |

FOREIGN PATENT DOCUMENTS

| | | | | |
|---|---|---|---|---|
| JP | 1048687 | | 2/2008 | |
| JP | 5168762 | | 3/2013 | |
| KR | 10-0870119 | | 11/2008 | |
| KR | 10-1293565 | | 8/2013 | |
| KR | 10-2014-0007683 | | 1/2014 | |
| KR | 10-2018-0042571 | | 4/2018 | |
| WO | WO-2019085045 A1 * | 5/2019 | | H01L 51/5206 |

OTHER PUBLICATIONS

Machine translation, Xing, WIPO Pat. Pub. No. WO-2019085045-A1, translation date: Mar. 15, 2022, Clarivate Analytics, all pages. (Year: 2022).*

* cited by examiner

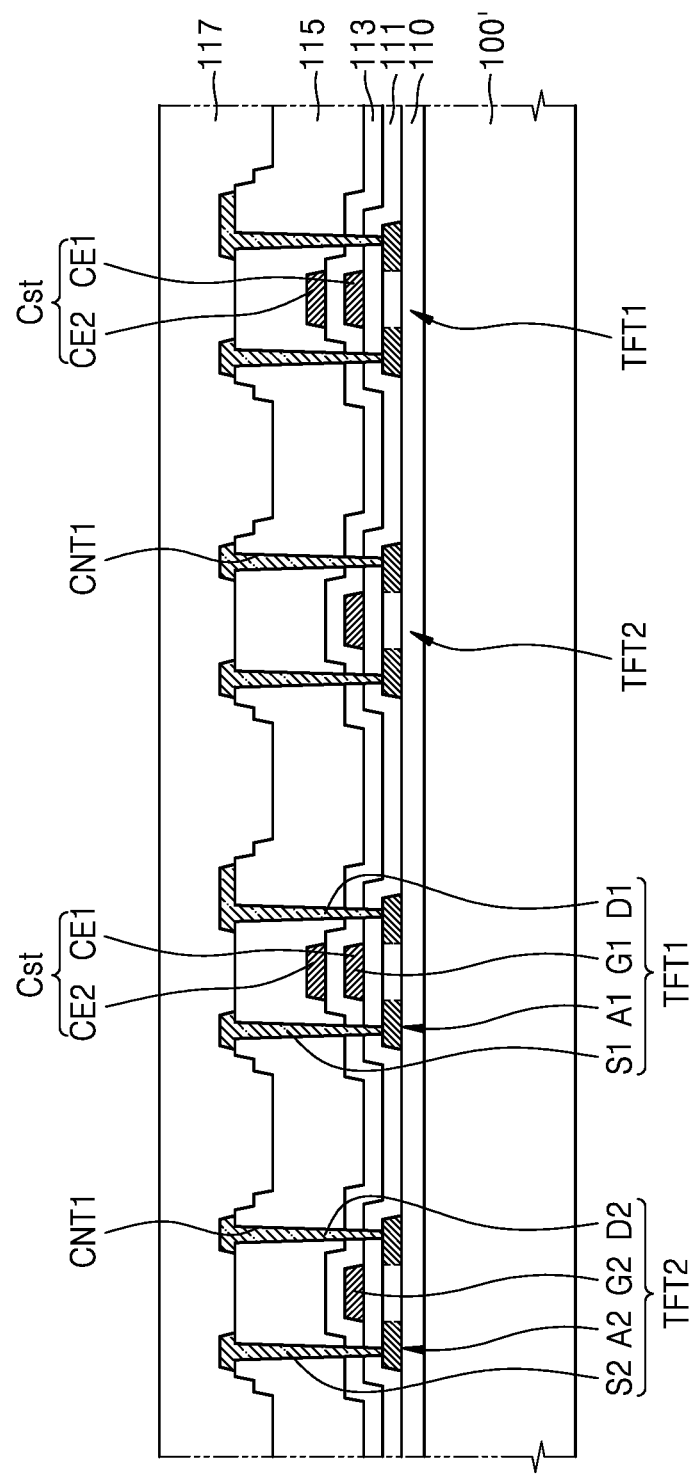

METHOD OF MANUFACTURING DISPLAY APPARATUS

CROSS-REFERENCE TO RELATED APPLICATION

This application claims priority under 35 U.S.C. § 19 to Korean Patent Application No. 10-2020-0001565, filed on Jan. 6, 2020, in the Korean Intellectual Property Office, the disclosure of which is incorporated by reference herein in its entirety.

TECHNICAL FIELD

One or more exemplary embodiments of the present invention relate to a method of manufacturing a display apparatus, and more particularly, to a method of manufacturing a display apparatus including performing a dry cleaning on components of the display apparatus.

DISCUSSION OF THE RELATED ART

A display apparatus is an apparatus for displaying data. Display apparatuses may be used as displays for small products, such as mobile phones, or may be used as displays for large products such as televisions.

Typically, a display apparatus includes a plurality of pixels that receive electric signals and emit light to display an image to the outside based on the received electric signals. Each pixel includes a light-emitting device. For example, an organic light-emitting display apparatus includes an organic light-emitting diode (OLED) as a light-emitting device. In general, an organic light-emitting display apparatus includes a thin-film transistor and an OLED, and the OLED emits light by itself.

As the applications of display apparatuses have diversified, various designs have been attempted to increase the quality of the display apparatuses. For example, light-emitting devices, included in display apparatuses, with increased life-time usage have been under development.

SUMMARY

According to an exemplary embodiment of the present invention, a method of manufacturing a display apparatus includes: forming a pixel electrode on a substrate; forming a pixel defining layer covering at least an edge of the pixel electrode and including an opening exposing a part of the pixel electrode; performing first dry cleaning by adding oxygen gas ($O_2$) to a surface of the pixel electrode exposed by the opening in the pixel defining layer, wherein the oxygen gas ($O_2$) is added at a flow rate in a range of about 1,200 sccm to about 3,600 sccm; performing second dry cleaning after the first dry cleaning; forming an intermediate layer on the pixel electrode after the second dry cleaning; and forming an opposite electrode on the intermediate layer and the pixel defining layer.

In an exemplary embodiment of the present invention, the first dry cleaning includes removing organic residue from the surface of the pixel electrode.

In an exemplary embodiment of the present invention, the organic residue includes the same material as that of the pixel defining layer.

In an exemplary embodiment of the present invention, the method further includes: forming a planarization layer on the substrate; forming a contact hole through the planarization layer; and performing third dry cleaning on the planarization layer and the contact hole.

In an exemplary embodiment of the present invention, the performing of the first dry cleaning is substantially the same as the performing of the third dry cleaning.

In an exemplary embodiment of the present invention, the method further includes performing a cleaning process between the first dry cleaning and the second dry cleaning.

In an exemplary embodiment of the present invention, the method further includes performing an oven process.

In an exemplary embodiment of the present invention, the flow rate of the oxygen gas ($O_2$) during the first dry cleaning is greater than a flow rate of oxygen gas ($O_2$) during the second dry cleaning.

In an exemplary embodiment of the present invention, the second dry cleaning is performed by adding the oxygen gas ($O_2$) at a flow rate of about 20 sccm or less.

In an exemplary embodiment of the present invention, the second dry cleaning is performed by adding nitrogen gas ($N_2$) at a flow rate in a range of about 200 sccm to about 600 sccm.

In an exemplary embodiment of the present invention, source power is applied during the first dry cleaning and the second dry cleaning.

In an exemplary embodiment of the present invention, the source power applied during the first dry cleaning is in a range of about 500 W to about 1,500 W, and the source power applied during the second dry cleaning is in a range of about 300 W to about 800 W.

In an exemplary embodiment of the present invention, bias power is applied during the first dry cleaning.

In an exemplary embodiment of the present invention, the bias power applied during the first dry cleaning is in a range of about 750 W to about 2,250 W.

In an exemplary embodiment of the present invention, pressure is applied during the first dry cleaning and the second dry cleaning.

In an exemplary embodiment of the present invention, the pressure applied during the first dry cleaning is in a range of about 5 mTorr to about 35 mTorr, and the pressure applied during the second dry cleaning is about 5 mTorr or less.

In an exemplary embodiment of the present invention, a process time of the first dry cleaning is in a range of about 15 seconds to about 45 seconds.

In an exemplary embodiment of the present invention, a process time of the second dry cleaning is in a range of about 50 seconds to about 80 seconds.

In an exemplary embodiment of the present invention, a part of the pixel defining layer is removed during the first dry cleaning to increase a width of the opening exposing the part of the pixel electrode.

In an exemplary embodiment of the present invention, a thickness of the pixel defining layer is reduced by about 1 µm or less.

BRIEF DESCRIPTION OF THE DRAWINGS

The above and other features of the present invention will become more apparent by describing in detail exemplary embodiments thereof, with reference to the accompanying drawings, in which:

FIGS. 5A, 5B, 5C, 5D, 5E, and 5F are cross-sectional views sequentially illustrating a method of manufacturing a display apparatus, according to an exemplary embodiment of the present invention;

DETAILED DESCRIPTION OF THE EMBODIMENTS

Figure 1:
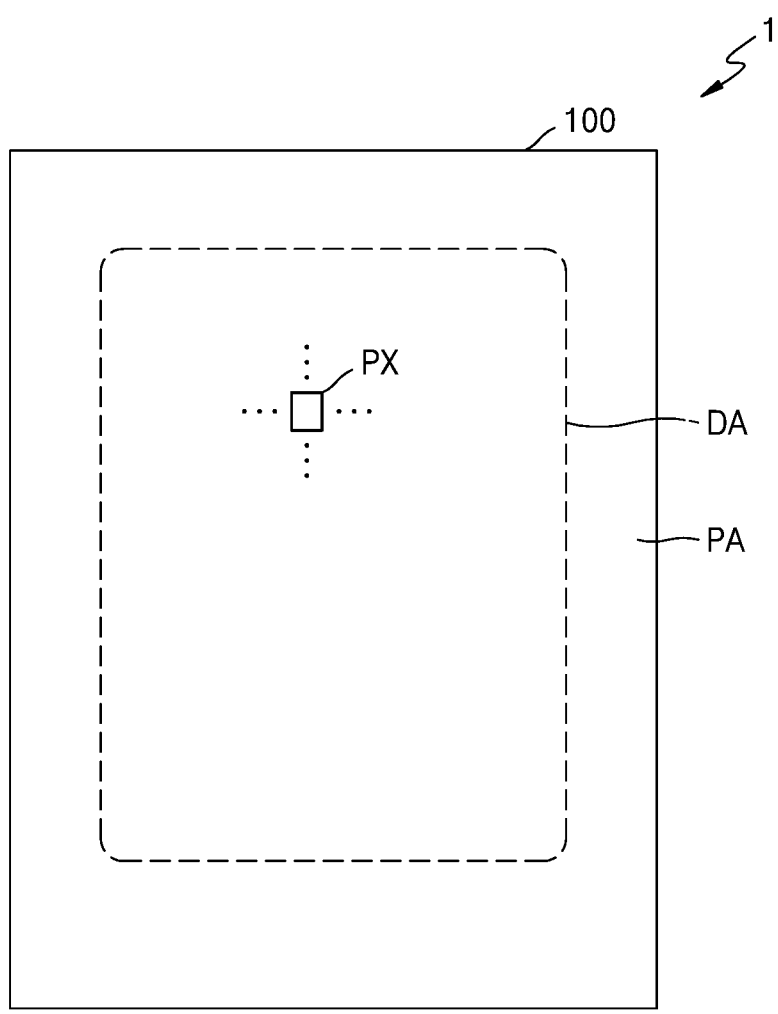
FIG. 1 is a schematic plan view of a display apparatus according to an exemplary embodiment of the present invention.

Exemplary embodiments of the present invention will now be described more fully with reference to the accompanying drawings. It is to be understood that the present invention may be embodied in different forms and thus should not be construed as being limited to the exemplary embodiments set forth herein. It is to be understood that like reference numerals may refer to like elements throughout the specification, and thus redundant descriptions may be omitted. As used herein, the term "and/or" includes any and all combinations of one or more of the associated listed items.

It will be understood that although the terms "first," "second," etc. may be used herein to describe various elements, these elements should not be limited by these terms. These terms are only used to distinguish one element from another. Thus, a first component discussed below could be termed a second component without departing from the spirit and scope of the present invention.

In addition, the singular forms "a," "an," and "the" are intended to include the plural forms as well, unless the context clearly indicates otherwise.

Sizes of components in the drawings may be exaggerated for clarity. In other words, because the sizes and thicknesses of elements in the drawings may be exaggerated for clarity, the present invention is not limited thereto.

When an exemplary embodiment of the present invention may be implemented differently, a process order may be performed differently from the described order. For example, two consecutively described processes may be performed substantially at the same time or performed in an order opposite to the described order.

In the following embodiments, it will be understood that when a film, layer, region, element, or component is referred to as being "connected to" or "coupled to" another film, layer, region, element, and component, it may be directly connected or coupled to the other film, layer, region, element, or component or intervening elements.

It is to be understood that the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Hereinafter, exemplary embodiments of the present invention will be described in detail with reference to the accompanying drawings.

FIG. 1 is a schematic plan view of a display apparatus 1 according to an exemplary embodiment of the present invention.

Referring to FIG. 1, the display apparatus 1 may include a display area DA in which an image is displayed, and a peripheral area PA arranged around the display area DA. The display apparatus 1 may provide an image to the outside by using light emitted from the display area DA.

A substrate 100 may include various materials, for example, glass, metal, or plastics. According to an exemplary embodiment of the present invention, the substrate 100 may include a flexible material. The flexible material refers to a substrate that may be bendable, foldable, or rollable. The substrate 100 including the flexible material may include, for example, ultra-thin glass, metal, or plastics.

A pixel PX may be arranged in the display area DA of the substrate 100. The pixel PX may include a display element such as an organic light-emitting diode (OLED). The pixel PX may include a plurality of pixels. The pixels PX may be arranged in various forms, for example, a stripe form, a pantile form, or a mosaic form, and implement an image.

In a plan view, the display area DA may be provided in a rectangular shape, as illustrated in FIG. 1. In an exemplary embodiment of the present invention, the display area DA may be provided in a polygonal shape (e.g., a triangular shape, a pentagonal shape, a hexagonal shape, etc.), a circular shape, an elliptical shape, or a combination thereof.

The peripheral area PA of the substrate 100 is an area arranged around the display area DA and may be an area in which an image is not displayed. Various lines configured to transmit an electric signal to the display area DA, pads to which a printed circuit board (PCB) or a driver integrated circuit (IC) chip is attached, and the like may be located in the peripheral area PA.

Figure 2:
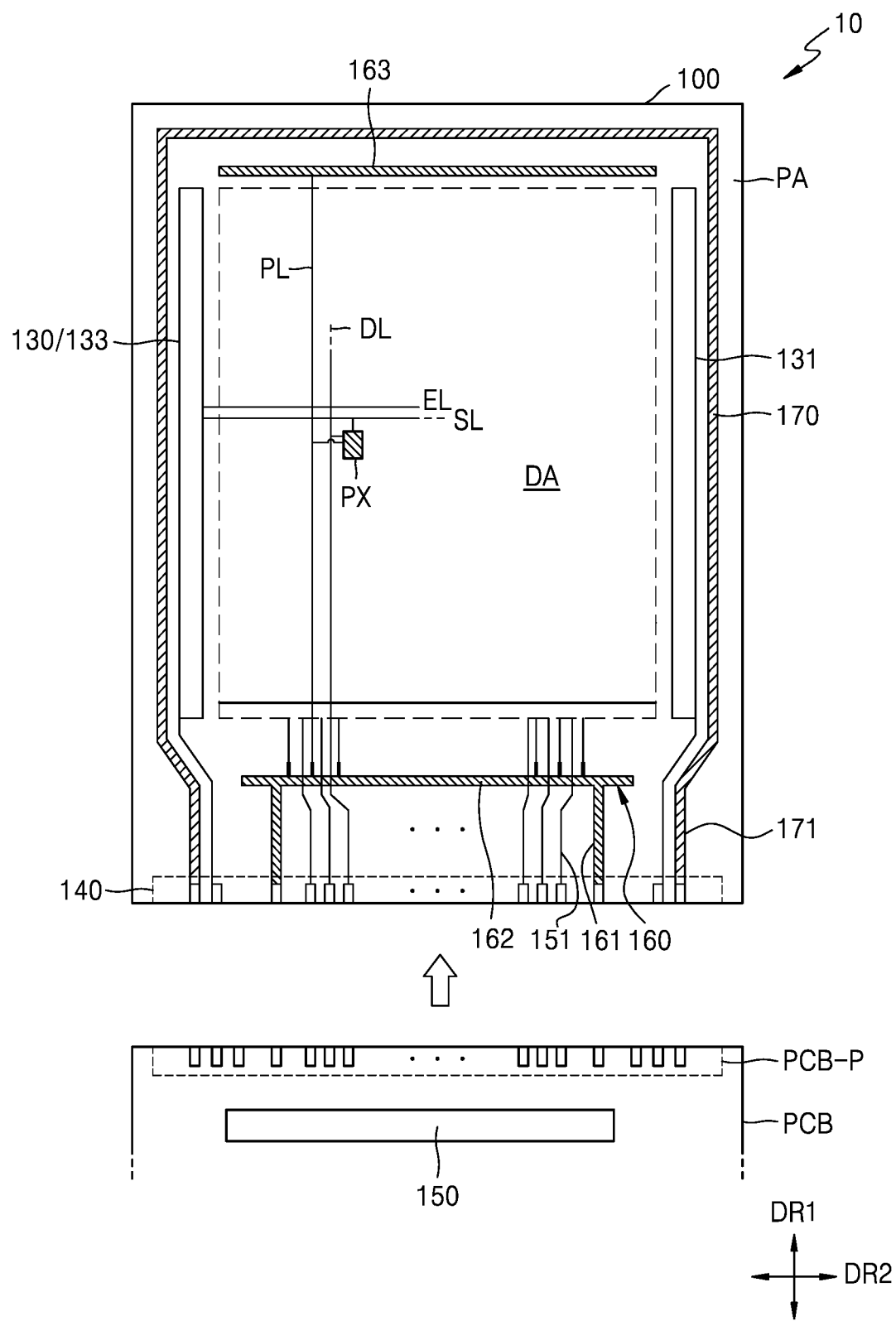
FIG. 2 is a schematic plan view of a display panel according to an exemplary embodiment of the present invention.

FIG. 2 is a schematic plan view of a display panel 10 according to an exemplary embodiment of the present invention.

Referring to FIG. 2, the display panel 10 may include a display area DA and a peripheral area PA and may include a plurality of pixels PX arranged in the display area DA. The pixels PX may each include a display element such as an OLED. The pixels PX may each emit, for example, red light, green light, blue light, or white light from the OLED. Hereinafter, in this specification, the pixels PX refer to sub-pixels that emit light of different colors, and the pixels PX may each be, for example, one of a red (R) sub-pixel, a green (G) sub-pixel, or a blue (B) sub-pixel. The display area DA may be covered with an encapsulation member to be protected from external air or moisture.

The pixels PX may each be electrically connected to external circuits arranged in the peripheral area PA. A first scan driving circuit 130, a second scan driving circuit 131, an emission control driving circuit 133, a terminal 140, a data driving circuit 150, a first power supply line 160, and a second power supply line 170 may be arranged in the peripheral area PA.

The first scan driving circuit 130 and the second scan driving circuit 131 may provide scan signals to the pixels PX through scan lines SL. The second scan driving circuit 131 may be arranged in parallel with the first scan driving circuit 130, with the display area DA therebetween. Some pixels PX arranged in the display area DA may be electrically connected to the first scan driving circuit 130, and the other pixels PX may be electrically connected to the second scan driving circuit 131. In an exemplary embodiment of the present invention, the second scan driving circuit 131 may be omitted.

The emission control driving circuit 133 may provide emission control signals to the pixels PX through emission control lines EL.

The terminal 140 may be arranged on one side of the substrate 100. The terminal 140 may be exposed without being covered by an insulating layer, and thus, au be electrically connected to a printed circuit board PCB. A terminal PCB-P of the printed circuit board PCB may be electrically connected to the terminal 140 of the display panel 10. The printed circuit board PCB may transmit a signal or power of a controller to the display panel 10.

A control signal generated by the controller may be transmitted to the first and second scan driving circuits 130 and 131 through the printed circuit board PCB. The controller may provide first and second power supply voltages (ELVDD and ELVSS of FIG. 3) to the first and second power supply lines 160 and 170 through first and second connection lines 161 and 171, respectively. The first power supply voltage ELVDD may be provided to the pixel PX through a driving voltage line PL connected to the first power supply line 160, and the second power supply voltage ELVSS may be provided to an opposite electrode (230 of FIG. 5F) of the pixel PX connected to the second power supply line 170.

The data driving circuit 150 may be electrically connected to a data line DL. A data signal of the data driving circuit 150 may be provided to the pixel PX through a connection line 151 and the data line DL. The connection line 151 is connected to the terminal 140, and the data line DL is connected to the connection line 151. FIG. 2 illustrates that the data driving circuit 150 is arranged on the printed circuit board PCB. However, in an exemplary embodiment of the present invention, the data driving circuit 150 may be arranged on the substrate 100. For example, the data driving circuit 150 may be arranged between the terminal 140 and the first power supply line 160.

The first power supply line 160 may include a first sub-line 162 and a second sub-line 163 extending parallel to each other and in the second direction DR2, with the display area DA therebetween. For example, the first sub-line 162 and the second sub-line 163 are respectively disposed at opposing sides of the display area DA. The second power supply line 170 may partially surround the display area DA. For example, the power supply line 170 may have a square or rectangular shape with one side that is open.

Figure 3:
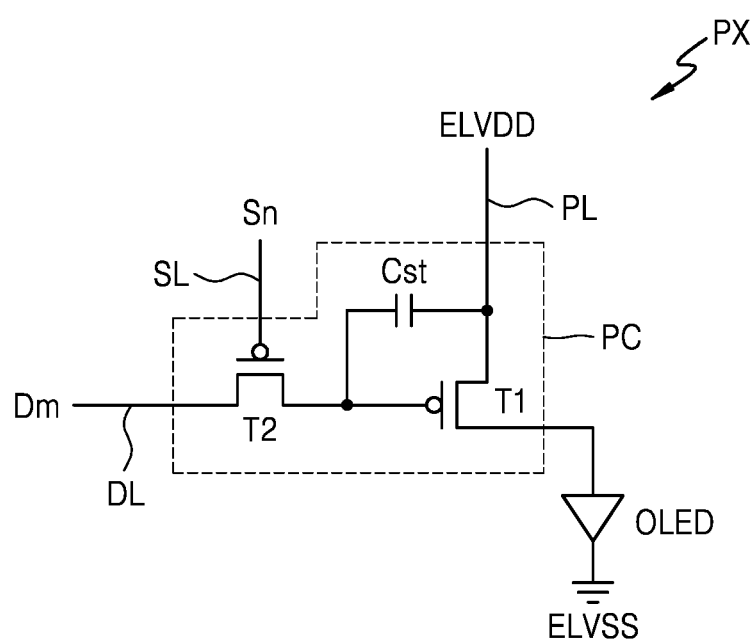
FIG. 3 is a circuit diagram of a pixel in display apparatus, according to an exemplary embodiment of the present invention.

FIG. 3 is a circuit, diagram of a pixel PX in a display apparatus, according to an exemplary embodiment of the present invention.

Referring to FIG. 3, the pixel PX includes a pixel circuit PC connected to a scan line SL and a data line DL, and an organic light emitting diode (OLED) connected to the pixel circuit PC.

The pixel circuit PC may include a driving thin-film transistor (TFT) T1, a switching TFT T2, and a storage capacitor Cst. The switching TFT T2 may be electrically connected to the scan line SL and the data line DL, and may be configured to transfer a data signal Dm to the driving TFT T1 through the data line DL according to a scan signal Sn input through the scan line SL.

The storage capacitor Cst may be electrically connected to the switching TFT T2 and the driving voltage line PL and may be configured to store a voltage corresponding to a difference between a voltage received from the switching TFT T2 and a driving voltage ELVDD supplied to the driving voltage line PL.

The driving TFT T1 may be electrically connected to the driving voltage line PL and the storage capacitor Cst, and may be configured to control a driving current flowing from the driving voltage line PL to the OLED according to a voltage value stored in the storage capacitor Cst. The OLED may emit light having a certain luminance according to the driving current.

A case in which the pixel circuit PC includes two TFTs and one storage capacitor has been described with reference to FIG. 3, but the present invention is not limited thereto. For example, the pixel circuit PC may include three or more TFTs and/or two or more storage capacitors.

Figure 4:
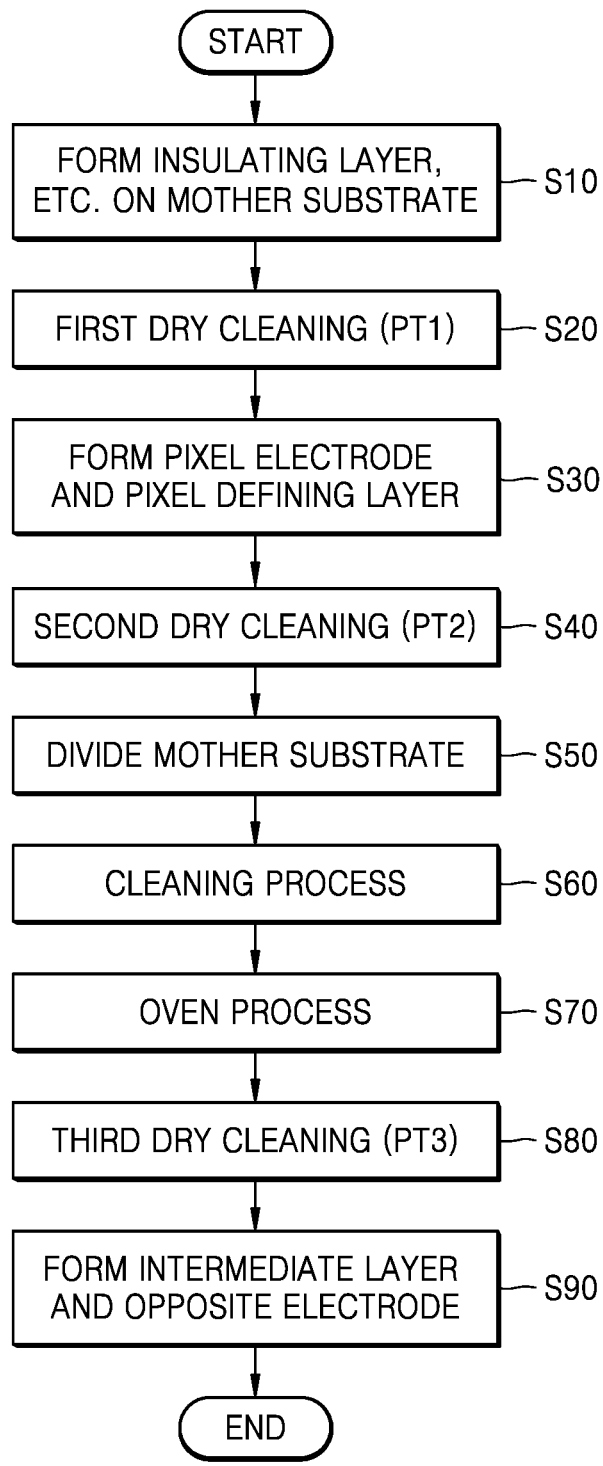
FIG. 4 is a flowchart of a method of manufacturing a display apparatus, according to an exemplary embodiment of the present invention.

FIG. 4 is a flowchart of a method of manufacturing a display apparatus, according to an exemplary embodiment of the present invention. FIGS. 5A to 5F are cross-sectional views sequentially illustrating a method of manufacturing a display apparatus, according to an exemplary embodiment of the present invention.

Referring to FIG. 4, a method of manufacturing a display device (1 of FIG. 1), according to an exemplary embodiment of the present invention, may include: forming an insulating layer or the like on a mother substrate 100' (S10); performing first dry cleaning PT1 thereon (S20); forming a pixel electrode 210 and a pixel defining layer 119 (S30); performing second dry cleaning PT2 on the pixel electrode 210 and the pixel defining layer 119 (S40); dividing the mother substrate 100' into a plurality of substrates 100 (S50); performing third dry cleaning PT3 on the pixel electrode 210 and the pixel defining layer 119 (S80); and forming an intermediate layer 220 and an opposite electrode 230 (S90).

In addition, in an exemplary embodiment of the present invention, after dividing the mother substrate 100' into the plurality of substrates 100, the method may further include performing a cleaning process (S60) and an oven process (S70).

The forming of the insulating layer or the like on the mother substrate 100' (S10) corresponds to sequentially forming gate insulating layers (111 and 113 of FIG. 5A) and an interlayer insulating layer (115 of FIG. 5A) on the mother substrate 100'.

In an exemplary embodiment of the present invention, the performing of the first dry cleaning PT1 (S20) may be the same as the performing of the second dry cleaning PT2 (S40), and the second dry cleaning PT2 may remove an organic residue (OR of FIG. 5C) on the surface of the pixel electrode 210. In this case, the organic residue OR on the surface of the pixel electrode 210 may include the same material as that of the pixel defining layer 119. For example, the first dry cleaning PT1 may clean an upper surface of a planarization layer (117 of FIG. 5B).

Hereinafter, a method of manufacturing a display apparatus, according to an exemplary embodiment of the present invention, will be described in detail according to a stacking order with reference to FIGS. 5A to 5F.

Referring to FIG. 5A, a buffer layer 110, semiconductor layers A1 and A2, a first gate insulating layer 111, gate electrodes G1 and G2, a second gate insulating layer 113, an upper electrode CE2, an interlayer insulating layer 115, and a planarization layer 117 are sequentially formed on a mother substrate 100'. A first gate electrode G1 of the gate electrodes G1 and G2 may also be a lower electrode CE1, and the lower electrode CE1 and the upper electrode CE2 may form a storage capacitor Cst.

The mother substrate 100' may include, for example, a glass material, a ceramic material, a metal material, or a material that is flexible or bendable. When the mother substrate 100' is flexible or bendable, the mother substrate 100' may include, for example, a polymer resin, such as polyethersulfone, polyacrylate, polyetherimide, polyethylene naphthalate, polyethyelene terephthalate, polyphenylene sulfide, polyarylate, polyimide, polycarbonate, or cellulose acetate propionate.

The mother substrate 100' may have a single-layered or multi-layered structure including the above-described material. In the case of the multi-layered structure, the mother substrate 100' may further include an inorganic layer. In an exemplary embodiment of the present invention, the mother substrate 100' may have a structure including a first organic layer, an inorganic layer disposed on the first organic layer, and a second organic layer disposed on the inorganic layer.

The buffer layer 110 may include, for example, silicon oxide ($SiO_2$) or silicon nitride ($SiN_x$), and may be formed by a deposition process such as chemical vapor deposition (CVD) or sputtering.

A barrier layer may be further included between the mother substrate 100' and the buffer layer 110. The barrier layer may prevent or minimize impurities from penetrating from the mother substrate 100' or the like into the semiconductor layers A1 and A2. The barrier layer may include an inorganic material such as oxide or nitride, an organic material, or an organic/inorganic composite, and may have a single-layered structure or a multi-layered structure including an inorganic material and an organic material.

The semiconductor layers A1 and A2 may be arranged on the buffer layer 110. The semiconductor layers A1 and A2 may be formed by patterning a preliminary semiconductor layer. The preliminary semiconductor layer may include, for example, amorphous silicon or oxide semiconductor and may be deposited by CVD. In addition, for example, when the preliminary semiconductor layer includes an amorphous silicon layer, after film formation, the preliminary semiconductor layer may be crystallized into a polycrystalline silicon layer by various methods, such as rapid thermal annealing (RTA), solid phase crystallization (SPC), excimer laser annealing (ELA), metal induced crystallization (MIC), metal induced lateral crystallization (MILC), or sequential lateral solidification (SLS).

In an exemplary embodiment of the present invention, the semiconductor layers A1 and A2 may each include an oxide of at least one of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and/or zinc (Zn).

The semiconductor layers A1 and A2 may each include a channel region, and a source region and a drain region arranged on both sides of the channel region. The semiconductor layers A1 and A2 may each be a single layer or a multi-layer.

The first gate insulating layer 111 and the second gate insulating layer 113 may be stacked and arranged on the mother substrate 100' to cover the semiconductor layers A1 and A2. The first gate insulating layer 111 and the second gate insulating layer 113 may each include, for example, silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), and hafnium oxide ($HfO_2$), or zinc oxide ($ZnO_2$), and may each be formed by a deposition process such as CVD or sputtering. However, the present invention is not limited thereto.

Gate electrodes G1 and G2 may be arranged on the first gate insulating layer 111 to at least partially overlap the semiconductor layers A1 and A2. For example, the gate electrodes G1 and G2 may respectively overlap the channel regions of the semiconductor layers A1 and A2. The gate electrodes G1 and G2 may each include, for example, molybdenum (Mo), aluminum (Al), copper (Cu), titanium (Ti), or the like and may be a single layer or a multi-layer. For example, the gate electrodes G1 and G2 may each be a single Mo layer.

The gate electrodes G1 and G2 are illustrated as being arranged on the first gate insulating layer 111, but in an exemplary embodiment of the present invention, the gate electrodes G1 and G2 may be arranged on the second gate insulating layer 113. In addition, the gate electrodes G1 and G2 of the TFTs TFT1 and TFT2 may be arranged on the same layer or may be arranged on different layers from each other.

The lower electrode CE1 of the storage capacitor Cst may be arranged on the first gate insulating layer 111 and may include the same material as that of the gate electrodes G1 and G2. The upper electrode CE2 of the storage capacitor Cst may overlap the lower electrode CE1 with the second gate insulating layer 113 therebetween and may generate a capacitance. In this case, the second gate insulating layer 113 may function as a dielectric layer of the storage capacitor Cst.

As illustrated in FIG. 5A, the lower electrode CE1 of the storage capacitor Cst may overlap the first TFT TFT1. For example, the gate electrode G1 of the first TFT TFT1 may function as the lower electrode CE1 of the storage capacitor Cst.

To form the gate electrodes G1 and G2 and the lower electrode CE1 of the storage capacitor Cst, a metal layer may be formed on the surface of the mother substrate 100' and then patterned. For example, the metal layer may be disposed on the entire surface of the mother substrate 100' before being patterned. The metal layer may be formed by a deposition process such as CVD, plasma enhanced CVD (PECVD), low pressure CVD (LPCVD), physical vapor deposition (PVD), sputtering, or atomic layer deposition (ALD), but the present invention not limited thereto. The method of forming the upper electrode CE2 of the storage capacitor Cst may be substantially the same as the method of forming the gate electrodes G1 and G2 and the lower electrode CE1 of the storage capacitor Cst.

An interlayer insulating layer 115 may be formed to cover the upper electrode CE2 of the storage capacitor Cst on the surface of the mother substrate 100'. For example, the interlayer insulating layer 115 may be disposed on an entire surface of the mother substrate 100'. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), and hafnium oxide ($HfO_2$), and/or zinc oxide ($ZnO_2$), and may be formed by a deposition process such as CVD or sputtering. However, present invention is not limited thereto.

A first contact hole CNT1 may be formed to pass through the first and second gate insulating layers 111 and 113 and the interlayer insulating layer 115, and may expose the source regions and/or the drain regions of the semiconductor layers A1 and A2.

Source electrodes S1 and S2 and drain electrodes D1 and D2 may each include a conductive material including molybdenum (Mo), aluminum (Al), copper (Cu), titanium (Ti), and the like, and may each be a single layer or a multi-layer including the above-described material. For example, the source electrodes S1 and S2 and the drain electrodes D1 and D2 may each have a multi-layered structure of Ti/Al/Ti. The source electrodes S1 and S2 and the drain electrodes D1 and D2 may be connected to the source regions or the drain regions of the semiconductor layers A1 and A2 through the first contact hole CNT1. For example, the source electrode S1 and S2 may be connected to the source regions of the semiconductor layers A1 and A2, and the drain electrodes D1 and D2 may connected to the drain regions of the semiconductor layers A1 and A2.

The source electrodes S1 and S2 and the drain electrodes D1 and D2 may be covered with an inorganic protective layer. The inorganic protective layer may be a single layer or a multi-layer of silicon nitride ($SiN_x$) and silicon oxide ($SiO_x$). The inorganic protective layer may be provided to cover and protect some lines arranged on the interlayer insulating layer 115.

A planarization layer 117 may be arranged on the interlayer insulating layer 115 to cover the source electrodes S1 and S2 and the drain electrodes D1 and D2. The planarization layer 117 may be a single layer or a multi-layer including an organic material or an inorganic material. The planarization layer 117 may include a general-purpose polymer (for example, benzocyclobutene (BCB), polyimide, hexamethyldisiloxane (HMDSO), polymethylmethacrylate (PMMA), or polystyrene (PS)), a polymer derivative having a phenol-based group, an acryl-based polymer, an imide-based polymer, an arylether-based polymer, an amide-based polymer, a fluorine-based polymer, a p-xylene-based polymer, a vinyl alcohol-based polymer, and any blend thereof. The planarization layer 117 may include, for example, silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$). After forming the planarization layer 117, chemical mechanical polishing may be performed thereon so as to provide a flat upper surface.

Figure 5B:
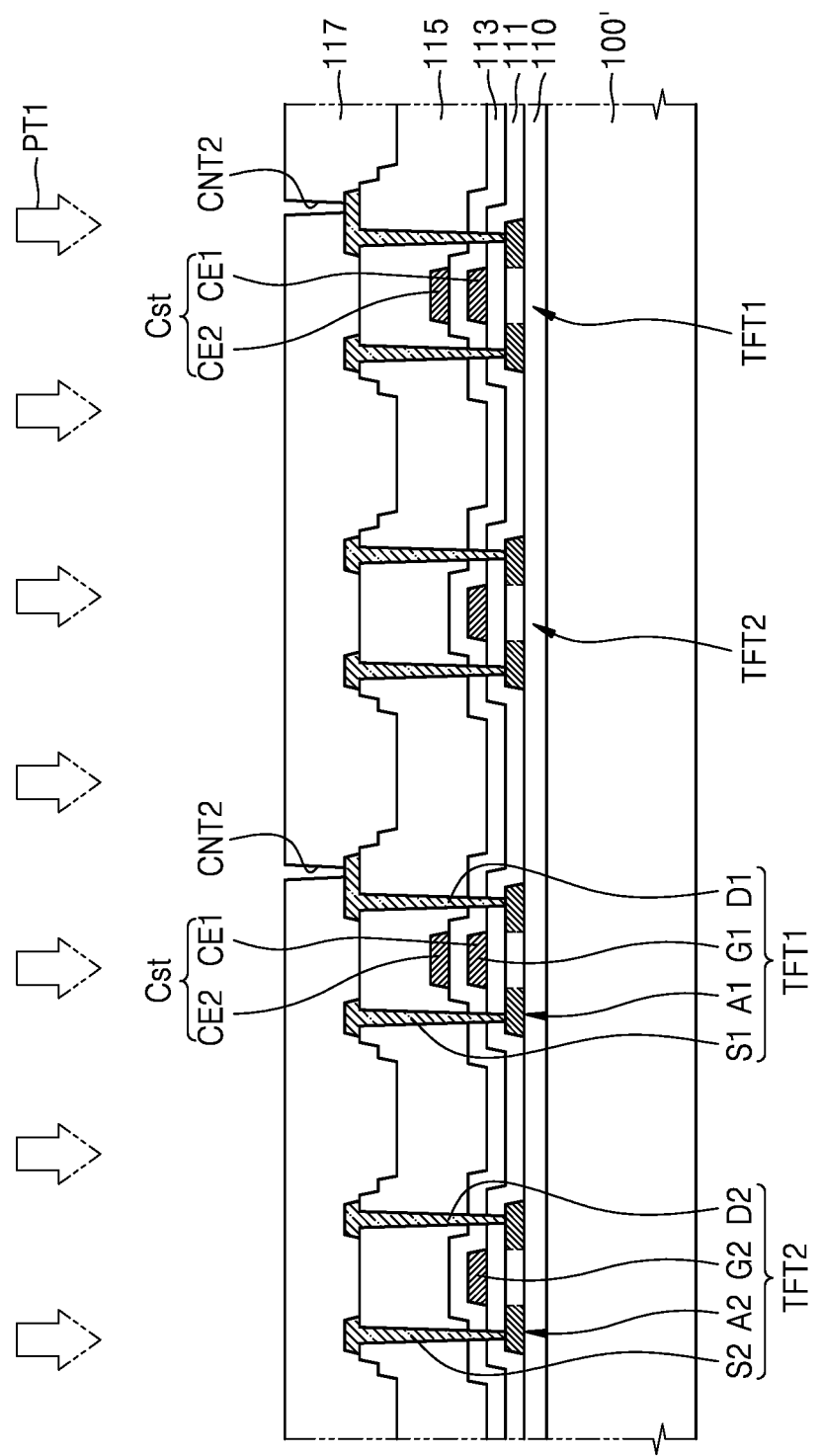

Referring to FIG. 5B, second contact holes CNT2 passing through the planarization layer 117 and exposing the drain electrodes D1 and D2 may be formed through a mask process.

After forming the second contact holes CNT2, first dry cleaning PT1 may be performed on the planarization layer 117. In an exemplary embodiment of the present invention, the first dry cleaning PT1 may be plasma treatment. The plasma treatment corresponds to a method of generating plasma by applying radio frequency to oxygen gas ($O_2$) or argon gas (Ar) and irradiating the surface of the planarization layer 117 to clean the surface of the planarization layer 117 through chemical reaction.

In an exemplary embodiment of the present invention, the first dry cleaning PT1 may be performed by adding oxygen gas ($O_2$). Because partial pressure of the oxygen gas ($O_2$) is higher than partial pressure of other gases, residues of the planarization layer 117, generated while forming the second contact hole CNT2, may be effectively removed.

In an exemplary embodiment of the present invention, a flow rate of the oxygen gas ($O_2$) during the first dry cleaning PT1 may be in a range of about 1,200 sccm to about 3,600 sccm. When the first dry cleaning PT1 is performed by adding the oxygen gas ($O_2$) in a range of about 1,200 sccm to about 3,600 sccm, foreign matters or particles may be removed from the surface of the planarization layer 117 at a rate of about 900 □/min.

In an exemplary embodiment of the present invention, pressure may be applied during the first dry cleaning PT1 and source power may be applied to generate plasma. For example, the oxygen gas ($O_2$) may be made into ionized gas by applying the source power. In an exemplary embodiment of the present invention, the pressure may be in a range of about 5 mTorr to about 35 mTorr, and the source power may be in a range of about 500 W to about 1,500 W.

In an exemplary embodiment of the present invention, bias power may be further applied during the first dry cleaning PT1. When the bias power is applied, the gas ionized by the source power is attracted to a voltage having an opposite polarity by the bias power. Hence, kinetic energy may be increased, thereby more effectively removing the residue or the like from the planarization layer 117. In addition, when the bias power is applied, the residue or the like may be uniformly removed from the planarization layer 117. In an exemplary embodiment of the present invention, the bias power may be applied in a range of about 750 W to about 2,250 W.

Figure 5C:
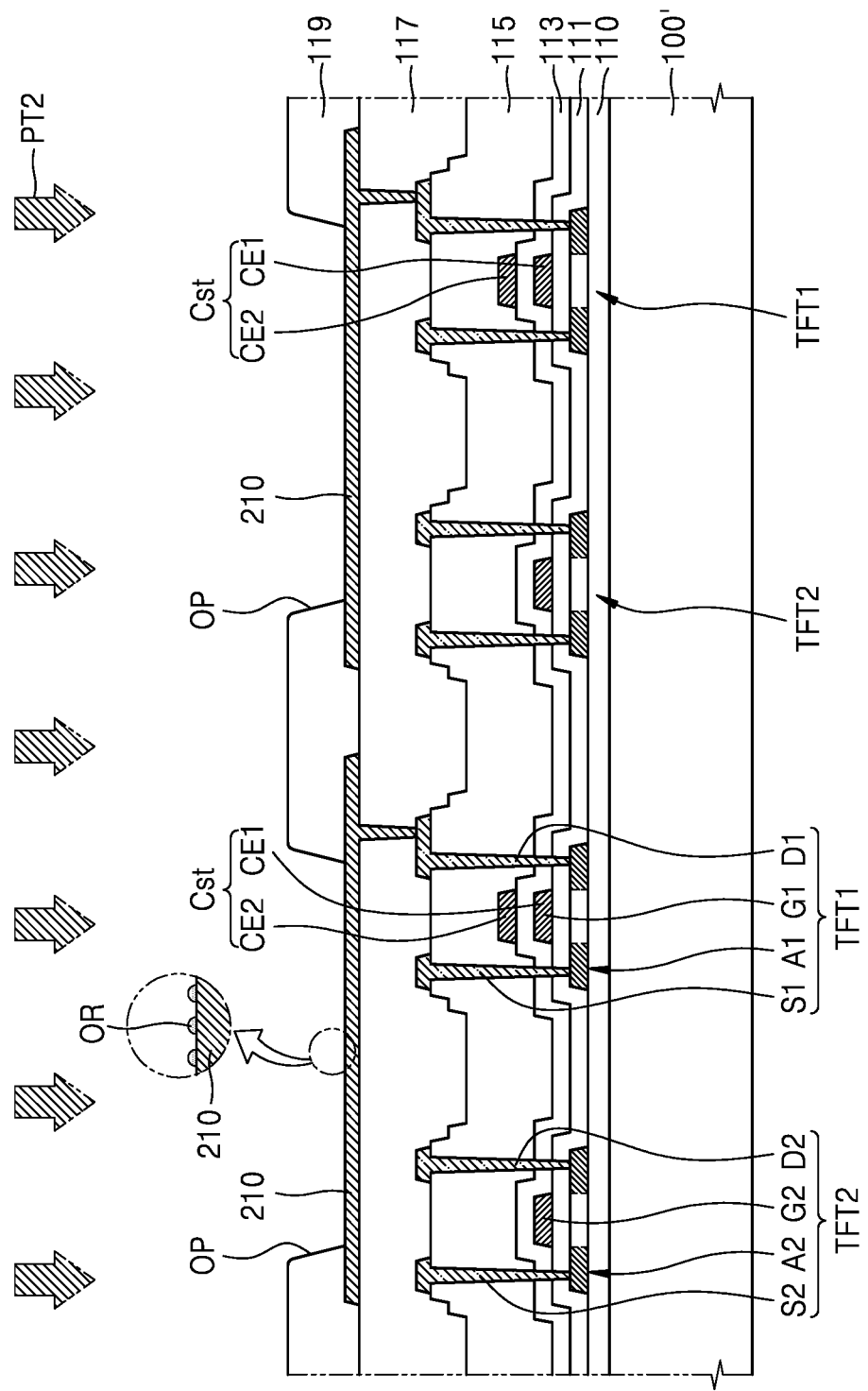

Referring to FIG. 5C, a pixel electrode 210 may be formed on the planarization layer 117. The pixel electrode 210 may be formed by, for example, depositing a conductive layer on the entire upper surface of the planarization layer 117 and performing a mask process and an etching process on the planarization layer 117.

The pixel electrode 210 may include a (semi)transmissive electrode or a reflective electrode. In an exemplary embodiment of the present invention, the pixel electrode 210 may include a reflective layer and a transparent or semitransparent electrode layer arranged above the reflective layer. The reflective layer may include, for example, Ag, Mg, Al, Pt, Pd, Au, Ni, Nd, Ir, Cr, or any compound thereof. The transparent or semitransparent electrode layer may include at least one of indium tin oxide (ITO), indium zinc oxide (IZO), zinc oxide (ZnO), indium oxide ($In_2O_3$), indium gallium oxide (IGO), and/or aluminum zinc oxide (AZO). In an exemplary embodiment of the present invention, the pixel electrode 210 may include ITO, Ag, and/or ITO.

Because the second contact hole (CNT2 of FIG. 5B) exposing the drain electrodes D1 and D2 is formed in the planarization layer 117, the pixel electrode 210 may be electrically connected to the drain electrodes D1 and D2 through the second contact hole CNT2. For example, the pixel electrode 210 may be connected to the first drain electrode D1 through the second contact hole CNT2.

A pixel defining layer 119 may be formed on the planarization layer 117. For example, the pixel defining layer 119 may be formed on the entire upper surface of the planarization layer 117. The pixel defining layer 119 may cover at least an edge of the pixel electrode 210 and include an opening OP exposing a central portion of the pixel electrode 210. The pixel defining layer 119 may include at least one organic insulating material, such as polyimide, polyimide, an acrylic resin, benzocyclobutene, and a phenol resin, and may be formed by spin coating or the like.

The pixel defining layer 119 may increase a distance between the edge of the pixel electrode 210 and the opposite electrode (230 of FIG. 5F) above the pixel electrode 210, thereby preventing arcs or the like from occurring at the edge of the pixel electrode 210.

After forming the pixel defining layer 119, second dry cleaning PT2 may be performed on the pixel defining layer 119. In an exemplary embodiment of the present invention, the second dry cleaning PT2 may be substantially the same as the first dry cleaning PT1 performed in FIG. 5B. For example, the second dry cleaning PT2 may be plasma treatment and may be performed by adding oxygen gas ($O_2$) in a range of about 1200 sccm to about 3,600 sccm.

When the second dry cleaning PT2 is performed by adding the oxygen gas ($O_2$) as in the present embodiment, the partial pressure of the oxygen gas ($O_2$) is higher than the partial pressure of other gases. Therefore, organic residue OR (e.g., residue of the pixel defining layer 119) generated on the surface of the pixel electrode 210 while forming the opening OP of the pixel defining layer 119 may be effectively removed. For example, when the second dry cleaning PT2 is performed by adding the oxygen gas ($O_2$) in a range of about 1,200 sccm to about 3,600 sccm, the organic residue OR may be removed from the pixel electrode 210 at a rate of about 900 □/min.

In an exemplary embodiment of the present invention, pressure may be applied during the second dry cleaning PT2, and source power and bias power may be applied as well. In an exemplary embodiment of the present invention, during the second dry cleaning PT2, the pressure may be applied in a range of about 5 mTorr to about 35 mTorr, the source power may be applied in a range of about 500 W to about 1,500 W, and the bias power may be applied in a range of about 750 W to about 2,250 W.

In a comparative example, when the dry cleaning is not performed after the pixel defining layer is formed, organic residue corresponding to part of the pixel defining layer may be present on the surface of the pixel electrode. This may change characteristics of an OLED arranged with the pixel electrode. Thus, the life time of the OLED may be shortened.

Therefore, in the present embodiment, the second dry cleaning PT2 may be performed after the pixel defining layer 119 is formed. When the pixel defining layer 119 including the opening OP is formed and the second dry cleaning PT2 is performed by adding the oxygen gas ($O_2$) and applying the pressure, the source power, the bias power, and the like, the organic residue OR may be uniformly removed from the surface of the pixel electrode 210, thereby improving the surface characteristics of the pixel electrode 210 and increasing the life time of the light-emitting device including the intermediate layer 220 that is the emission layer arranged on the pixel electrode 210.

In an exemplary embodiment of the present invention, the process time of the second dry cleaning PT2 may be in a range of about 15 seconds to about 45 seconds. In this case, the life time of the light-emitting device may be further increased. This will be described below with reference to FIG. 6.

In an exemplary embodiment of the present invention, part of the pixel defining layer 119 may be removed during the second dry cleaning PT2 to increase the width of the opening OP of the pixel defining layer 119. When the width of the opening OP is increased, an opening ratio may be increased. When the same driving current, as applied before the opening ratio is increased, is supplied, higher luminance may be obtained due to the increased opening ratio. In addition, when the aperture ratio is increased, the life time of the light-emitting device may be further increased.

In an exemplary embodiment of the present invention, when the process time of the second dry cleaning PT2 is about 30 seconds, the size of the pixel PX arranged on the display area DA illustrated in FIG. 1 may be increased by about 1 μm or less, for example, about 0.2 μm to about 0.3 μm. The size increase of the pixel PX may be due to a reduction of the thickness of the pixel defining layer 119 by about 1 μm or less while the second dry cleaning PT2 is performed for about 30 seconds.

In the present embodiment, when the thickness of the pixel defining layer 119 is reduced by about 1 μm or less due to the second dry cleaning PT2 and the size of the pixel PX is increased by about 1 μm or less, for example, about 0.2 μm to about 0.3 μm, the life time of the light-emitting device such as the OLED may be increased by about 20 hours.

Figure 5D:
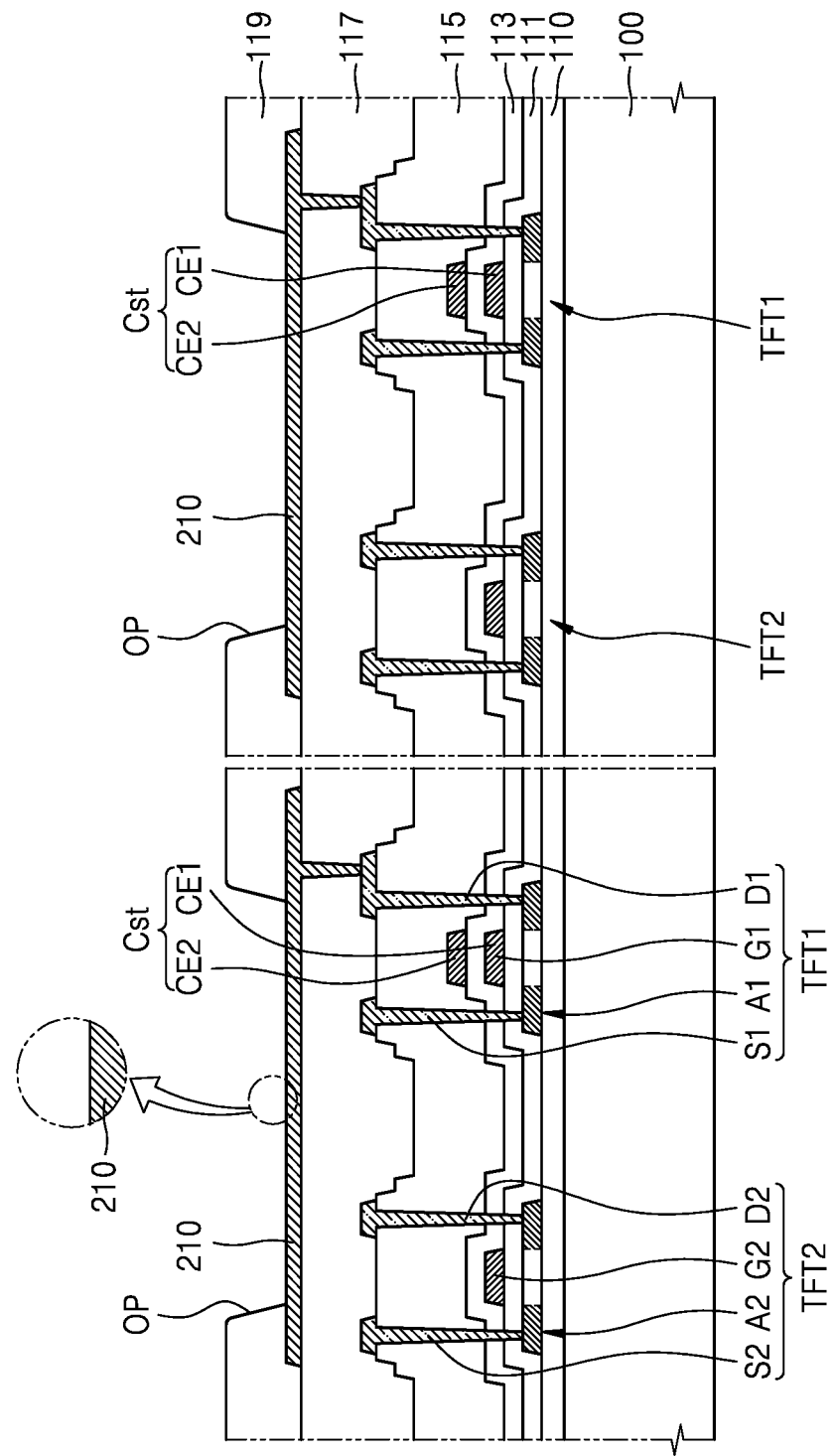

Referring to FIG. 5D, after the second dry cleaning PT2, the mother substrate 100' may be divided into a plurality of substrates 100 and a subsequent process may be performed on the plurality of substrates 100. In an exemplary embodiment of the present invention, the mother substrate 100' may be divided into the plurality of substrates 100 through, for example, laser cutting.

Figure 5E:
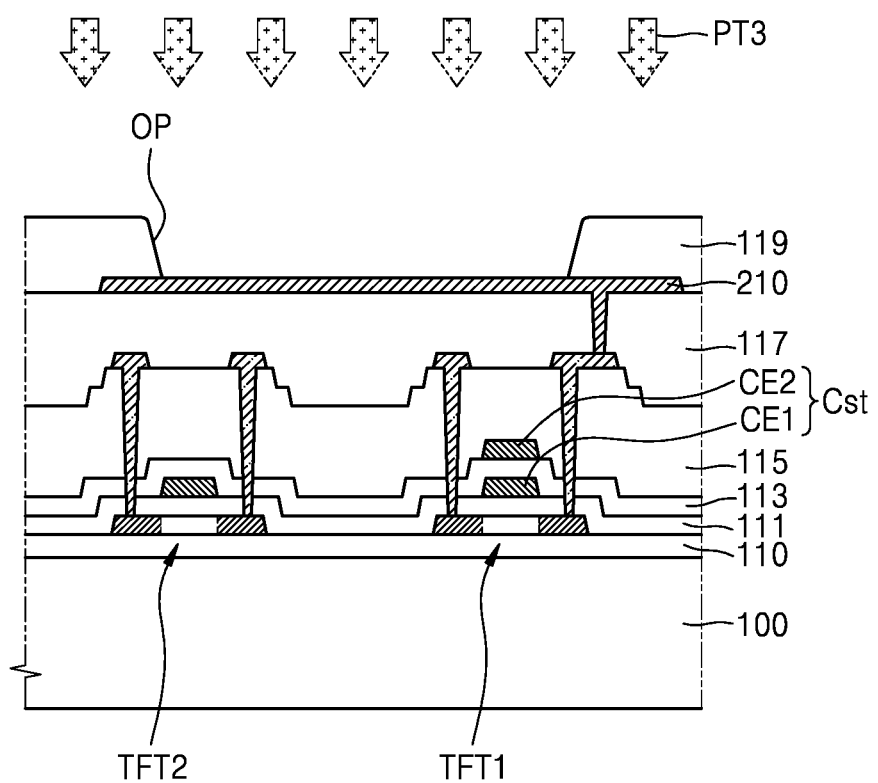

Referring to FIG. 5E, in an exemplary embodiment of the present invention, a cleaning process (S60 of FIG. 4), an oven process (S70 of FIG. 4), and a third dry cleaning PT3 (S80 of FIG. 4) may be sequentially performed on the surfaces of the pixel electrode 210 and the pixel defining layer 119 arranged on the substrate 100. In addition, FIG. 5E represents, as an example, one substrate of the plurality of substrates 100 for convenience of explanation. Further, the aforementioned process steps (S60, S70, S80) may be applied to the plurality of substrates 100.

In an exemplary embodiment of the present invention, the cleaning process S60 may wash away residual particles or the like present on the surfaces of the pixel electrode 210 and the pixel defining layer 119 by using water ($H_2O$), and the oven process S70 may correspond to a process of evaporating the water ($H_2O$) or the like, used during the cleaning process (S60), through heat.

In an exemplary embodiment of the present invention, the third dry cleaning PT3 may be plasma treatment. In addition, the third dry cleaning PT3 may be performed by adding nitrogen gas ($N_2$) and oxygen gas ($O_2$) to the surface of the pixel electrode 210 and the pixel defining layer 119. For example, a flow rate of the nitrogen gas ($N_2$) may be in a range of about 200 sccm to about 600 sccm, and a flow rate of the oxygen gas ($O_2$) may be in a range of about 20 sccm or less. For example, the flow rate of the oxygen gas ($O_2$) applied during the second dry cleaning PT2 may be greater than a flow rate of the oxygen gas ($O_2$) applied during the third dry cleaning PT3.

In addition, in an exemplary embodiment of the present invention, pressure may be applied during the third dry cleaning PT3 and source power may be applied to generate plasma. For example, the oxygen gas ($O_2$) may be made into ionized gas by applying the source power. In an exemplary embodiment of the present invention, the pressure during the third dry cleaning PT3 may be about 5 mTorr or less, and the source power may be in a range of about 300 W to about 800 W.

In the present embodiment, when the source power applied during the third dry cleaning PT3 is in a range of about 300 W to about 800 W, the life time of the light-emitting device may be further increased. Furthermore, because the source power is low, defects caused by static electricity may be reduced. This will be described below with reference to FIG. 7.

In a comparative example, the dry cleaning after the oven process may be omitted. In this case, the work function of the pixel electrode may be reduced. Because the work function of the pixel electrode is involved in hole injection into the emission layer, this may interfere with hole injection in the pixel electrode.

However, when the third dry cleaning PT3 is performed by adding the nitrogen gas ($N_2$) and oxygen gas ($O_2$) after the oven process S70 and applying the pressure, the source power, and the like according to the present embodiment, the work function of the pixel electrode 210 may be increased. The increase in the work function may promote hole injection into the intermediate layer 220 to increase the efficiency of the light-emitting device such as the OLED. In addition, the organic residue OR that may partially, remain on the surface of the pixel electrode 210 may be removed by the third dry cleaning PT3.

In an exemplary embodiment of the present invention, the process time of the third dry cleaning PT3 may be adjusted. For example, the process time of the third dry cleaning PT3 may be in a range of about 50 seconds to about 80 seconds, for example, about 65 seconds.

Figure 5F:
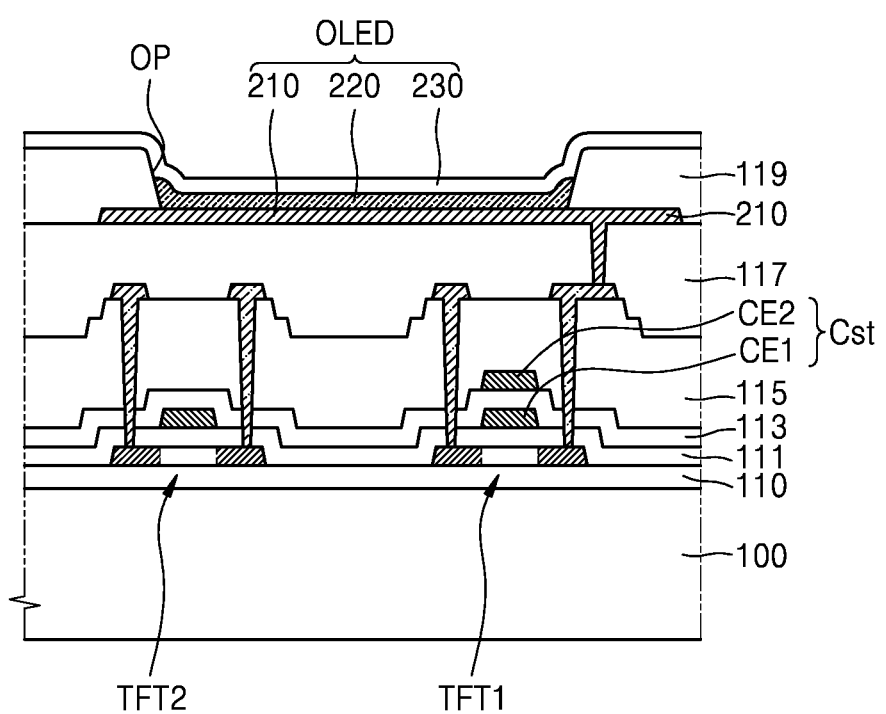

Referring to FIG. 5F, an intermediate layer 220 may be formed on the pixel electrode 210, on which the surface treatment has been performed through FIGS. 5C to 5E, for example, inside the opening OP of the pixel defining layer 119. The intermediate layer 220 may include a low-molecular-weight material or a high-molecular-weight material. The intermediate layer 220 may be formed by, for example, vacuum deposition, screen printing, inkjet printing, or laser induced thermal image (LITI).

The intermediate layer 220 of the OLED may include an organic emission layer. The organic emission layer may include an organic material including a fluorescent or phosphorescent material emitting red light, green light, blue light, or white light. The organic emission layer may be a low-molecular-weight organic material or a high-molecular-weight organic material. For example, functional layers such as a hole transport layer (HTL), a hole injection layer (HIL), an electron transport layer (ETL), and an electron injection layer (EIL) may be arranged above and below the organic emission layer. The intermediate layer 220 may be arranged to correspond to each of the pixel electrodes 210. However, the present invention is not limited thereto. For example, the intermediate layer 220 may be variously modified. For example, the intermediate layer 220 may include an integrated layer over the pixel electrodes 210.

An opposite electrode 230 may be formed to correspond to the OLEDs. For example, the opposite electrode 230 may be disposed on the intermediate layer 220 and may overlap the pixel electrodes 210. The opposite electrode 230 may be formed to cover the display area (DA of FIG. 1) of the substrate 100 through an open mask. The opposite electrode 230 may be formed by, for example, a deposition process such as CVD, PECVD, LPCVD, PVD, sputtering, or ALD.

The opposite electrode 230 may include a transmissive electrode or a reflective electrode. In an exemplary embodiment of the present invention, the opposite electrode 230 may include a transparent or semitransparent electrode and may include a metal thin-film that has a low work function and includes, for example, Li, Ca, LiF/Ca, LiF/Al, Al, Ag, Mg, or any compound thereof. In addition, a transparent conductive oxide (TCO) layer such as ITO, IZO, ZnO, or $In_2O_3$ may be further arranged on the metal thin-film.

FIGS. 6, 7, 8A, and 8B are graphs according to an exemplary embodiment of the present invention.

Figure 6:
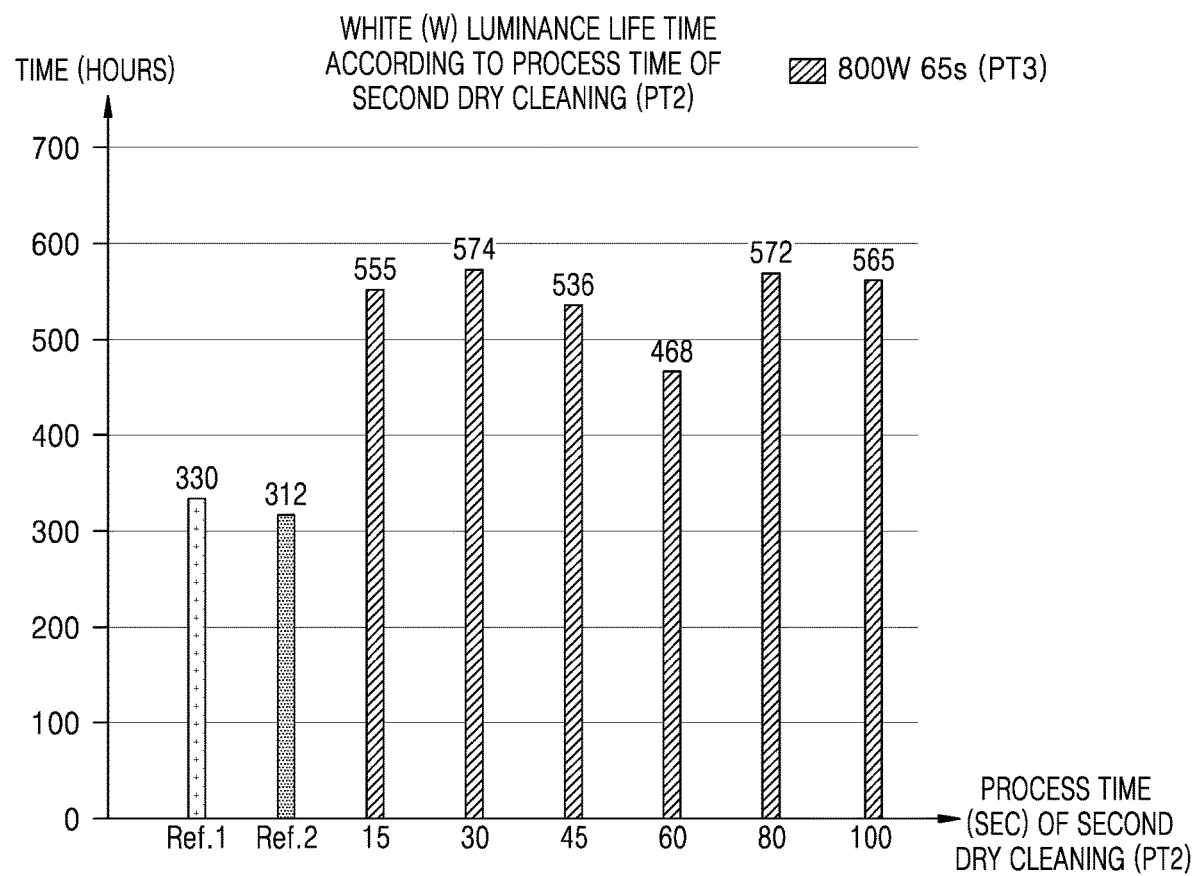
FIG. 6 is a graph according to an exemplary embodiment of the present invention.

FIG. 6 is a graph showing the white (W) luminance life time according to the process time of the second dry cleaning PT2.

FIG. 6 illustrates the white (W) luminance life time when the second dry cleaning PT2 was omitted and the third dry cleaning PT3 was performed for about 65 seconds with source power of about 1,000 W (Ref. 1). In addition, FIG. 6 illustrates the white (W) luminance life time when both the second dry cleaning PT2 and the third dry cleaning PT3 were omitted (Ref. 2), and when the second dry cleaning PT2 was performed for about 15 seconds to about 100 seconds and the third dry cleaning PT3 was performed for about 65 seconds with source power of about 800 W.

The time (hours) for the luminance life time illustrated in FIG. 6 refers to the amount of time that lapsed from the luminance of 100% to the luminance of 93%. For example, the time (hours) for the luminance life time illustrated in FIG. 6 is the time measured until the luminance dropped by 7%.

When the second dry cleaning PT2 was omitted and the third dry cleaning PT3 was performed for about 65 seconds with source power of about 1,000 W (Ref. 1), the white (W) luminance life time was about 330 hours, and when both the second dry cleaning PT2 and the third dry cleaning PT3 were omitted (Ref. 2), the white (W) luminance life time was about 312 hours.

When the second dry cleaning PT2 was performed for about 15 seconds to about 100 seconds and the third dry cleaning PT3 was performed for about 65 seconds with source power of about 800 W, the white (W) luminance life time was about 468 hours to about 574 hours, which was further increased than when the second dry cleaning PT2 was omitted (Ref. 1) and when both the second dry cleaning PT2 and the third dry cleaning PT3 were omitted (Ref. 2).

For example, because the white (W) life time was shortest when both the second dry cleaning PT2 and the third dry cleaning PT3 were omitted (Ref. 2), it may seem that the second dry cleaning PT2 and the third dry cleaning PT3 are associated with the luminance life time.

In an exemplary embodiment of the present invention, the process time of the second dry cleaning PT2 may be in a range of about 15 seconds to about 45 seconds, and the process time of the third dry cleaning PT3 may be in a range of about 50 seconds to about 80 seconds, for example, about 65 seconds. In addition, source power of about 800 W may be applied during the third dry cleaning PT3. In this case, referring to FIG. 6, it may seem that the white (W) luminance life time is most increased.

For example, according to an exemplary embodiment of the present invention, all organic residues (OR of FIG. 5C) present on the surface of the pixel electrode (210 of FIG. 5C) may be removed to improve surface characteristics of the pixel electrode 210. As a result, the life time of the light-emitting device including the intermediate layer (220 of FIG. 5F), which is the emission layer arranged on the pixel electrode 210, may be increased.

Figure 7:
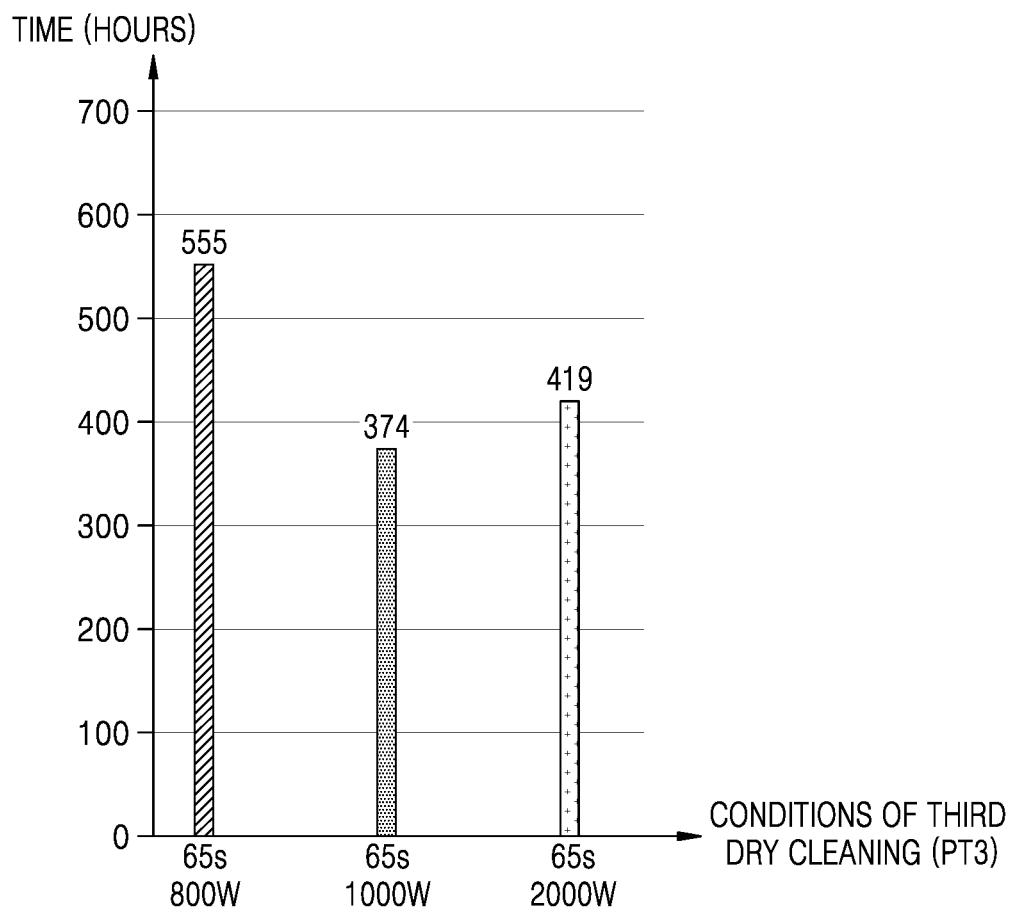
FIG. 7 is a graph according to an exemplary embodiment of the present invention.

FIG. 7 is a graph showing the white (W) luminance life time according to the source power applied during the third dry cleaning PT3.

For example, FIG. 7 shows the white (W) luminance life time by changing the conditions of the third dry cleaning PT3 after the second dry cleaning PT2 is performed for about 15 seconds. The luminance life time may correspond to the time taken until the luminance drops by 7% as described above with reference to FIG. 6.

In an exemplary embodiment of the present invention, the process time of the third dry cleaning PT3 may be adjusted. For example, the third dry cleaning PT3 may be performed for about 50 seconds to about 80 seconds, for example, about 65 seconds.

Referring to FIG. 7, when the third dry cleaning PT3 was performed with source power of about 800 W, the white (W) luminance life time was about 555 hours. When the third dry cleaning PT3 was performed with the source power of about 1,000 W, the white (W) luminance life time was about 374 hours. In addition, when the third dry cleaning PT3 was performed with source power of about 2,000 W, the white (W) luminance life time was about 419 hours. In this manner, it may be seen that when source power applied during the third dry cleaning PT3 was about 800 W, the white (W) luminance life time was most increased.

In an exemplary embodiment of the present invention, source power applied during the third dry cleaning PT3 may be in a range of 300 W to 800 W. In this case, the luminance life time may be increased. In addition, because the source power is low, defects caused by static electricity generated on the surface of the pixel electrode 210 may be reduced.

Figure 8A:
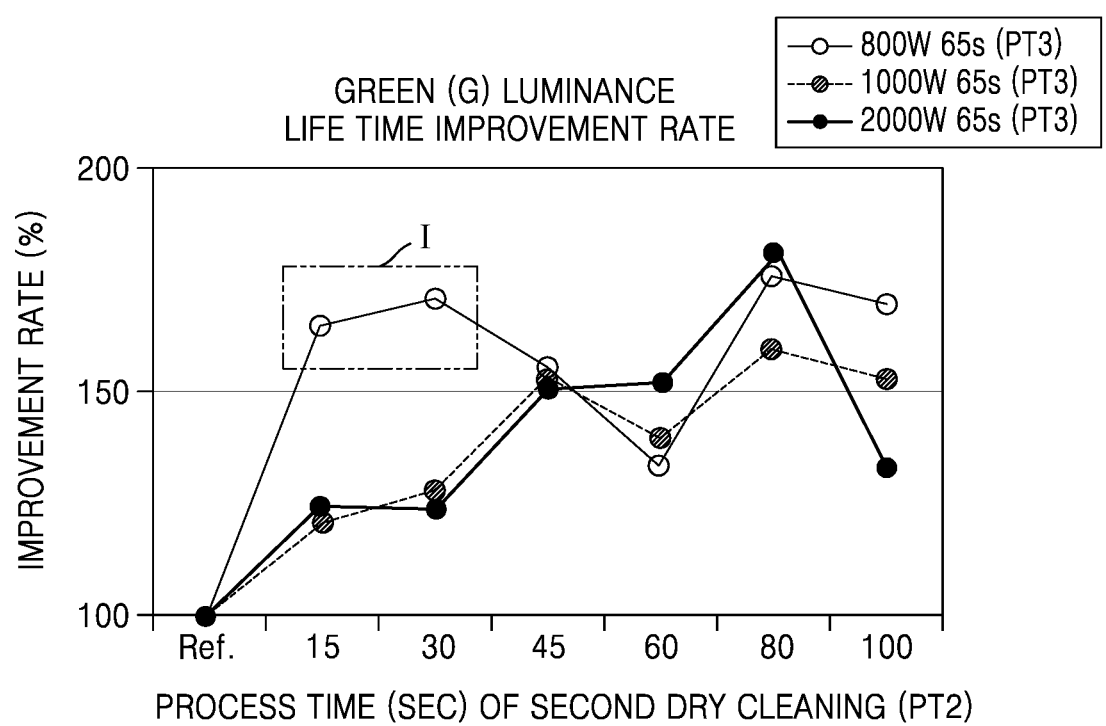
FIG. 8A is a graph according to an exemplary embodiment of the present invention.
Figure 8B:
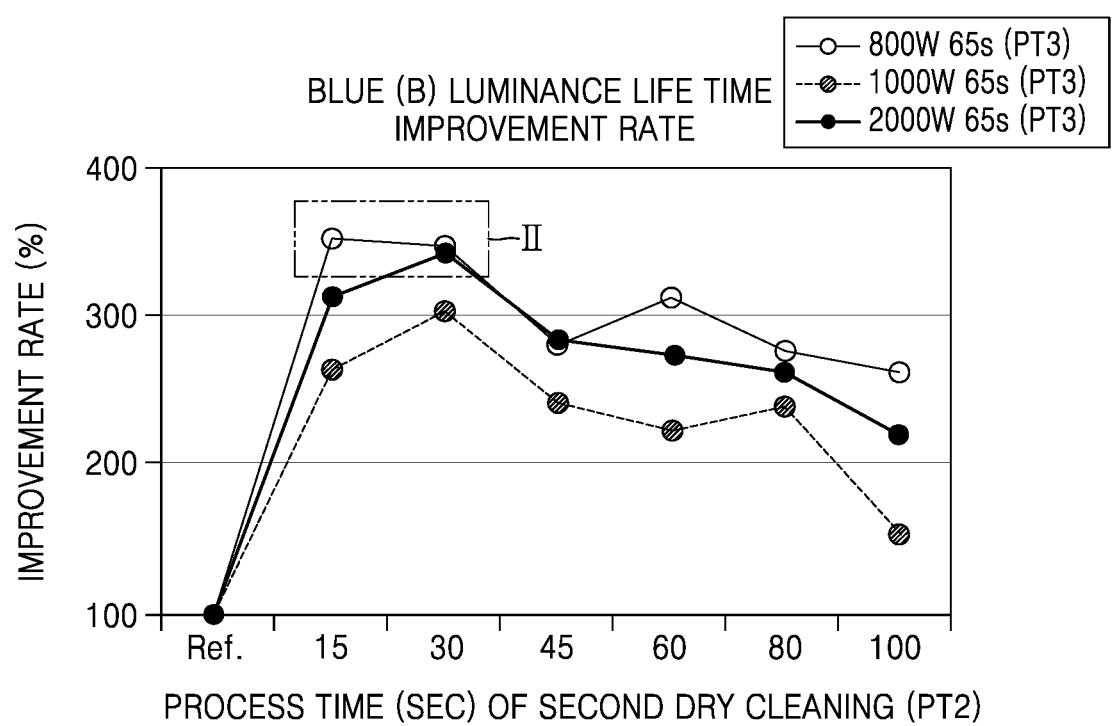
FIG. 8B is a graph according to an exemplary embodiment of the present invention.

FIG. 8A is a graph showing a green (G) luminance life time according to the process time of the second dry cleaning PT2 and, the conditions of the third dry cleaning PT3, and FIG. 8B is a graph showing a blue (B) luminance life time according to the process time of the second dry cleaning PT2 and the conditions of the third dry cleaning PT3.

FIGS. 8A and 8B illustrate the green (G) and blue (B) luminance life time improvement rates (%) when the third dry cleaning PT3 was performed with source power of about 800 W and the process time of the second dry cleaning PT2 was changed (corresponding to a white point), when the third dry cleaning PT3 was performed with source power of about 1,000 W and the process time of the second dry cleaning PT2 was changed (corresponding to a hatched point), and when the third dry cleaning PT3 was performed with source power of about 2,000 W and the process time of the second dry cleaning PT2 was changed (corresponding to a black point), based on the luminance life time when the second dry cleaning PT2 was omitted (Ref. 1).

It may be seen that the green (G) and blue (B) luminance life time is increased more when the second dry cleaning PT2 is performed than when the second dry cleaning PT2 is omitted (Ref. 1).

For example, referring to region I of FIG. 8A, when the third dry cleaning PT3 is performed with the source power of about 800 W and the process time of the second dry cleaning PT2 is in a range of about 15 seconds to about 30 seconds, the green (G) luminance life time may be increased by about 70% than when the second dry cleaning PT2 is omitted (Ref. 1).

Similarly, referring to region II of FIG. 8B, when the third dry cleaning PT3 is performed with the source power of about 800 W and the process time of the second, dry cleaning PT2 is in a range of about 15 seconds to about 30 seconds, the blue (B) luminance life time may be increased by about 250% than when the second dry cleaning PT2 is omitted (Ref. 1).

In addition, comparing the conditions of the third dry cleaning PT3 when the second dry cleaning PT2 was performed for about 15 seconds to about 30 seconds, it may be seen that the green (G) and blue (B) luminance life time was increased most when the source power was about 800 W.

In an exemplary embodiment of the present invention, the second dry cleaning PT2 and the third dry cleaning PT3 may be performed before the intermediate layer 220, which is the emission layer, is deposited on the pixel electrode 210. In this manner, the organic residue OR may be removed from the pixel electrode 210, thereby increasing the life time of the light-emitting device including the intermediate layer 220. Furthermore, because the work function of the pixel electrode 210 may be increased, hole injection in the pixel electrode 210 may be facilitated.

As described above, according to an exemplary embodiment of the present invention, the method of manufacturing the display apparatus, in which the life time of the light-emitting device is increased may be provided. The scope of the present invention is not limited by these effects.

While the present invention has been described with reference to exemplary embodiments thereof, it will be understood by those of ordinary skill in the art that various changes in form and details may be made thereto without departing from the spirit and scope of the present invention.

What is claimed is:

1. A method of manufacturing a display apparatus, the method comprising:
   forming a pixel electrode on a substrate;
   forming a pixel defining layer covering at least an edge of the pixel electrode and including an opening exposing a part of the pixel electrode;
   performing first dry cleaning by adding oxygen gas ($O_2$) to a surface of the pixel electrode exposed by the opening in the pixel defining layer, wherein the oxygen gas ($O_2$) is added at a flow rate in a range of about 1,200 sccm to about 3,600 sccm;
   performing second dry cleaning after the first dry cleaning;
   forming an intermediate layer on the pixel electrode after the second dry cleaning; and
   forming an opposite electrode on the intermediate layer and the pixel defining layer.

2. The method of claim 1, wherein the first dry cleaning comprises removing organic residue from the surface of the pixel electrode.

3. The method of claim 2, wherein the organic residue includes the same material as that of the pixel defining layer.

4. The method of claim 1, further comprising:
   forming a planarization layer on the substrate;
   forming a contact hole through the planarization layer; and
   performing third dry cleaning on the planarization layer and the contact hole.

5. The method of claim 4, wherein the performing of the first dry cleaning is substantially the same as the performing of the third dry cleaning.

6. The method of claim 1, further comprising performing a cleaning process between the first dry cleaning and the second dry cleaning.

7. The method of claim 6, further comprising performing an oven process.

8. The method of claim 1, wherein the flow rate of the oxygen gas ($O_2$) during the first dry cleaning is greater than a flow rate of oxygen gas ($O_2$) during the second dry cleaning.

9. The method of claim 8, wherein the second dry cleaning is performed by adding the oxygen gas ($O_2$) at a flow rate of about 20 sccm or less.

10. The method of claim 9, wherein the second dry cleaning is performed by adding nitrogen gas ($N_2$) at a flow rate in a range of about 200 sccm to about 600 sccm.

11. The method of claim 1, wherein source power is applied during the first dry cleaning and the second dry cleaning.

12. The method of claim 11, wherein the source power applied during the first dry cleaning is in a range of about 500 W to about 1,500 W, and
   the source power applied during the second dry cleaning is in a range of about 300 W to about 800 W.

13. The method of claim 11, wherein bias power is applied during the first dry cleaning.

14. The method of claim 13, wherein the bias power applied during the first dry cleaning is in a range of about 750 W to about 2,250 W.

15. The method of claim 13, wherein pressure is applied during the first dry cleaning and the second dry cleaning.

16. The method of claim 15, wherein the pressure applied during the first dry cleaning is in a range of about 5 mTorr to about 35 mTorr, and the pressure applied during the second dry cleaning is about 5 mTorr or less.

17. The method of claim 15, wherein a process time of the first dry cleaning is in a range of about 15 seconds to about 45 seconds.

18. The method of claim 17, wherein a process time of the second dry cleaning is in a range of about 50 seconds to about 80 seconds.

19. The method of claim 1, wherein a part of the pixel defining layer is removed during the first dry cleaning to increase a width of the opening exposing the part of the pixel electrode.

20. The method of claim 19, wherein a thickness of the pixel defining layer is reduced by about 1 μm or less.

* * * * *